(12) United States Patent
Chang

(10) Patent No.: US 11,757,071 B2
(45) Date of Patent: Sep. 12, 2023

(54) WAVELENGTH CONVERSION DEVICE AND MANUFACTURING METHOD THEREOF

(71) Applicant: Coretronic Corporation, Hsin-Chu (TW)

(72) Inventor: Kuo-Chou Chang, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 12 days.

(21) Appl. No.: 17/383,439

(22) Filed: Jul. 23, 2021

(65) Prior Publication Data

US 2022/0029069 A1    Jan. 27, 2022

(30) Foreign Application Priority Data

Jul. 27, 2020   (CN) .......................... 202010730622.5

(51) Int. Cl.
*H01L 33/50* (2010.01)
*H01L 33/60* (2010.01)
*H01L 33/64* (2010.01)

(52) U.S. Cl.
CPC .......... *H01L 33/504* (2013.01); *H01L 33/60* (2013.01); *H01L 33/641* (2013.01)

(58) Field of Classification Search
CPC ...... H01L 33/502; H01L 33/501; H01L 33/50
See application file for complete search history.

(56) References Cited

U.S. PATENT DOCUMENTS

| | | | | |
|---|---|---|---|---|
| 11,009,205 B2* | 5/2021 | Eberhardt | ............ | H01S 5/0087 |
| 2006/0027781 A1* | 2/2006 | Dong | ................ | C09K 11/7734 |
| | | | | 252/62.52 |
| 2007/0221867 A1* | 9/2007 | Beeson | ................. | H05B 33/10 |
| | | | | 250/487.1 |

(Continued)

FOREIGN PATENT DOCUMENTS

| | | |
|---|---|---|
| CN | 204052092 | 12/2014 |
| CN | 104428907 | 3/2015 |
| CN | 104968995 | 10/2015 |

(Continued)

OTHER PUBLICATIONS

"Office Action of China Counterpart Application", dated Jul. 19, 2022, p. 1-p. 9.

*Primary Examiner* — Andrew J Coughlin
(74) *Attorney, Agent, or Firm* — JCIPRNET

(57) ABSTRACT

A manufacturing method of a wavelength conversion device, and a wavelength conversion device manufactured by the method are provided. The manufacturing method of the wavelength conversion device of the disclosure includes the following steps. A wavelength conversion material layer is formed on a substrate by a sol-gel method. The wavelength conversion material layer includes a first colloidal material, and a fluorescent material. The wavelength conversion material layer is solidified, thereby forming a wavelength conversion layer including a plurality of first microstructures. The step of solidifying the wavelength conversion material layer includes irradiating the wave- (Continued)

length conversion material layer with a laser. The manufacturing method of the wavelength conversion device and the wavelength conversion device provided by the disclosure have advantages such as a simple process, and low manufacturing cost.

16 Claims, 4 Drawing Sheets

(56) References Cited

U.S. PATENT DOCUMENTS

2016/0040857 A1* 2/2016 Inoue ........................ F21V 7/30
  362/343

FOREIGN PATENT DOCUMENTS

| | | |
|---|---|---|
| CN | 107255865 | 10/2017 |
| CN | 108147830 | 6/2018 |
| CN | 208297917 | 12/2018 |
| CN | 105805699 | 1/2019 |
| CN | 208937892 | 6/2019 |
| CN | 110352368 | 10/2019 |
| CN | 110579933 | 12/2019 |

* cited by examiner

WAVELENGTH CONVERSION DEVICE AND MANUFACTURING METHOD THEREOF

CROSS-REFERENCE TO RELATED APPLICATION

This application claims the priority benefit of China application serial no. 202010730622.5, filed on Jul. 27, 2020. The entirety of the above-mentioned patent application is hereby incorporated by reference herein and made a part of this specification.

BACKGROUND

Technical Field

This disclosure relates to an optical device and a manufacturing method thereof, and in particular to a wavelength conversion device and a manufacturing method thereof.

Description of Related Art

A wavelength conversion layer may be produced by first mixing organic glue such as silica gel with fluorescent powder, and then heating and solidifying the mixture. However, the wavelength conversion layer including organic glue is less resistant to high temperatures, and has poor thermal conductivity. Based on this, the use of inorganic glue as a material of the wavelength conversion layer has become one of the current trends. For example, inorganic glue may be used to make phosphor in glass (PIG), or phosphor in ceramic (PIC), etc. Among them, the phosphor in ceramic has advantages such as high temperature resistance, high thermal conductivity, and high light transmittance. A phosphor in ceramic manufacturing process usually includes sequentially carrying out processes such as ball milling, batching, mixing, shaping, drying, and sintering. A static pressing process is often used during the sintering of the phosphor in ceramic, which is difficult to operate and has a high manufacturing cost. The phosphor in ceramic sintered by the static pressing process has a flat surface, and an anti-reflection layer is subsequently plated on the surface of the phosphor in ceramic to reduce light reflection.

The information disclosed in this background section is only for enhancement of understanding of the background of the described technology, and therefore it may contain information that does not form the prior art that is already known to a person of ordinary skill in the art. Furthermore, the information disclosed in this section does not mean that one or more problems to be resolved by one or more embodiments of the disclosure were acknowledged by a person of ordinary skill in the art.

SUMMARY

The disclosure provides a manufacturing method of a wavelength conversion device, which is a convenient process, and can reduce the manufacturing cost. The disclosure also provides a wavelength conversion device, which has high light conversion efficiency.

The manufacturing method of the wavelength conversion device of the disclosure includes the following steps. A wavelength conversion material layer is formed on a substrate by a sol-gel method. The wavelength conversion material layer includes a first colloidal material, and a fluorescent material. The wavelength conversion material layer is solidified, thereby forming a wavelength conversion layer including a plurality of first microstructures. The step of solidifying the wavelength conversion material layer includes irradiating the wavelength conversion material layer with a laser.

The wavelength conversion device of the disclosure includes a substrate, and a wavelength conversion layer. The wavelength conversion layer includes a plurality of first microstructures on a surface away from the substrate, and the wavelength conversion layer may be produced by the following method. A wavelength conversion material layer is formed on the substrate by a sol-gel method. The wavelength conversion material layer includes a first colloidal material, and a fluorescent material. The wavelength conversion material layer is solidified, thereby forming the wavelength conversion layer including the multiple first microstructures. The step of solidifying the wavelength conversion material layer includes irradiating the wavelength conversion material layer with a laser.

Based on the above, an embodiment of the disclosure forms the wavelength conversion material layer on the substrate by the sol-gel method. The first colloidal material in the wavelength conversion material layer may be melted by laser sintering to bond the fluorescent material and the substrate, thereby forming the wavelength conversion layer. In the process, the wavelength conversion layer may be fixed on the substrate, and no additional adhesive such as a tape is required. The method of the disclosure can increase convenience of the process, simplify the process, and reduce the manufacturing cost. The wavelength conversion layer formed by the method of the disclosure includes the multiple first microstructures. The plurality of first microstructures allow most of the light beam emitted by the laser source to enter the wavelength conversion layer, and reduce the reflection of the light beam, therefore increasing the light conversion efficiency of the wavelength conversion layer.

Other objectives, features and advantages of the disclosure can be further understood from the further technological features disclosed by the embodiments of the disclosure, wherein there are shown and described as preferred embodiments of the disclosure, simply by way of illustration of modes best suited to carry out the disclosure.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the descriptions, serve to explain the principles of the disclosure.

DESCRIPTION OF THE EMBODIMENTS

Figure 1:
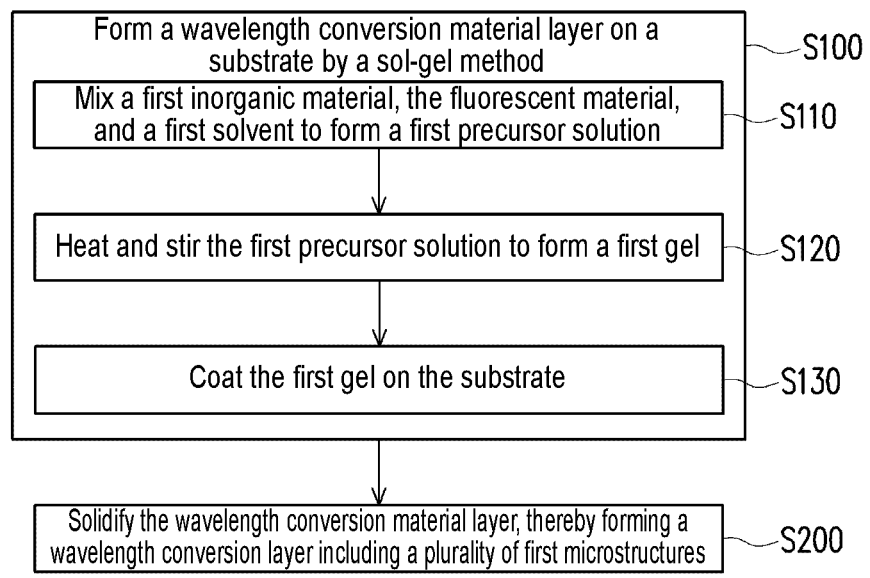
FIG. 1 is a flowchart of a manufacturing method of a wavelength conversion device according to an embodiment of the disclosure.

In the following detailed description of the exemplary embodiments, reference is made to the accompanying drawings which form a part hereof, and are shown by way of illustration, specific embodiments in which the disclosure may be practiced. In this regard, directional terminology, such as "top", "bottom", "front", "back", etc., is used with reference to the orientation of the figure(s) being described. The components of the disclosure may be positioned in a number of different orientations. As such, the directional terminology is used for purposes of illustration and is in no way limiting.

On the other hand, the drawings are only schematic and the sizes of components may be exaggerated for clarity. It is to be understood that other embodiments may be utilized and structural changes may be made without departing from the scope of the disclosure. Also, it is to be understood that the phraseology and terminology used herein are for the purpose of description and should not be regarded as limiting.

Terms such as "including", "comprising", or "having", and variations thereof herein is meant to encompass the items listed thereafter and equivalents thereof as well as additional items. Unless limited otherwise, the terms "connected", "coupled", "mounted", and variations thereof herein are used broadly and encompass direct and indirect connections, couplings, and mountings.

Similarly, the terms "facing", "faces", and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Reference will now be made in detail to the exemplary embodiments of the disclosure, and examples of the exemplary embodiments are illustrated in the accompanying drawings. Whenever possible, the same reference symbols are used in the drawings and the description to indicate the same or similar parts. The disclosure may also be embodied in various different forms, and should not be limited to the embodiments described in the text. The thickness of the layers and regions in the drawings are exaggerated for clarity. The same or similar reference numerals indicate the same or similar elements, and will not be reiterated one by one in the following paragraphs. In addition, the directional terms mentioned in the embodiments, for example, "up", "down", "left", "right", "front", or "back", etc., are only directions with reference to the drawings. Therefore, the directional terms are used for illustration, and not to limit the disclosure.

FIG. 1 is a flowchart of a manufacturing method of a wavelength conversion device according to an embodiment of the disclosure. With reference to FIG. 1, in Step S100, a wavelength conversion material layer is formed on a substrate by a sol-gel method. In some embodiments, the wavelength conversion material layer includes a first colloidal material, and a fluorescent material. The first colloidal material includes, for example, a metal hydroxide, and the type of metal may be optionally selected depending on a precursor used for the sol-gel method. For example, the first colloidal material may include aluminum hydroxide. The fluorescent material may be, for example, an inorganic fluorescent material, and is not particularly limited by the disclosure. In some embodiments, the fluorescent material includes a plurality of fluorescent particles. The fluorescent particles generate colored light after being irradiated by an excitation beam.

The following paragraphs will introduce an embodiment of forming the wavelength conversion material layer by the sol-gel method. As shown in FIG. 1, the Step S100 includes Step S110, Step S120, and Step S130, but the disclosure is not limited thereto.

With reference to FIG. 1, in Step S110, a first inorganic material, the fluorescent material, and a first solvent are mixed to form a first precursor solution. The first inorganic material may, for example, include a ceramic precursor material. In some embodiments, the first inorganic material includes a metal salt such as aluminum chloride ($AlCl_3$), aluminum nitrate ($Al(NO_3)_3$), or a combination thereof, but the disclosure is not limited thereto. In other embodiments, the first inorganic material may include a metallic alkoxy compound. The first solvent may be, for example, an organic solvent, and is not particularly limited by the disclosure.

In Step S120, the first precursor solution is stirred to form a first gel. The temperature may be further increased during the stirring of the first precursor solution. In detail, after the first inorganic material, the fluorescent material and the first solvent are mixed to form the first precursor solution, the first precursor solution may be heated to a range of 60° C. to 100° C., and stirred for a period of 10 minutes to 120 minutes. The first inorganic material may undergo a hydrolysis reaction and a polycondensation reaction with the first solvent. The hydrolysis reaction causes metal cations in the first inorganic material to be hydrolyzed to be formed as reactive monomers with hydroxyl (—OH). The polycondensation reaction causes the reactive monomers to polymerize with each other and undergo dehydration to form the first colloidal material (sol). The first colloidal material is further polymerized gradually, and forms a first gel, such as a ceramic gel, with the fluorescent material. In other embodiments, an adhesive may be selectively added to the first precursor solution. For example, the adhesive may be added during the stirring process. The adhesive is, for example, a polymer soluble in the first solvent. For example, the adhesive may include polyvinyl alcohol, polyvinyl butyral resin, polyvinylpyrrolidone, or a combination thereof.

In Step S130, the first gel is coated on the substrate. The method of coating the first gel on the substrate may be, for example, a scraper molding method, a dispensing method, a printing molding method, or an injection molding method. As of now, the wavelength conversion material layer has been formed on the substrate.

In step S200, the wavelength conversion material layer is solidified, thereby forming a wavelength conversion layer including multiple first microstructures. In the embodiment, the method of solidifying the wavelength conversion material layer includes sintering the wavelength conversion material layer with a laser. In detail, after the wavelength conversion material layer is irradiated by the laser, the first colloidal material in the wavelength conversion material layer melts and deforms to bond the fluorescent material and the substrate, thereby forming the wavelength conversion layer with a plate-like structure. However, it should be noted that the temperature of the heat source generated by the laser is not higher than the melting point of the fluorescent material. Therefore, the fluorescent material does not melt and deform. The first colloidal material in the wavelength conversion material layer of the embodiment may be melted by laser sintering to bond the fluorescent material and the substrate. In the above process, the wavelength conversion layer may be fixed on the substrate, and no additional adhesive such as a tape is required, therefore the convenience of the process can be increased.

In some embodiments, the first colloidal material may be melted and deformed after being irradiated by laser, thereby forming the plurality of first microstructures on a laser-irradiated surface, and a first groove may be formed between two adjacent microstructures. For example, when the wavelength conversion device manufactured by the method is applied to a projection system, the blue light from a laser light source of a light source system (not shown) irradiates a surface of the wavelength conversion layer. Since the surface has the plurality of first microstructures and a plurality of first grooves located therebetween, a part of the blue light may enter the first grooves without being reflected, thereby exciting the fluorescent material in the wavelength conversion layer to, for example, emit yellow light. Since less blue light is reflected, the light conversion efficiency of the wavelength conversion layer may be increased. Based on this, the wavelength conversion layer of the embodiment may also have good anti-reflection capability without the disposition of an additional anti-reflection layer, therefore the manufacturing cost can be reduced.

In some embodiments, a thickness of the wavelength conversion layer is, for example, from 0.1 mm to 0.5 mm. In some embodiments, a depth of the first groove is less than half of the thickness of the wavelength conversion layer. For example, the depth of the first groove may be less than 0.25 mm. In some embodiments, the plurality of first grooves of the wavelength conversion layer may be arranged in an array.

In some embodiments, in Step S200, when sintering the wavelength conversion material layer with the laser, parameters of the laser such as power, scanning speed, and laser frequency may affect a spacing of the formed microstructures, and the depth of the grooves. For example, when sintering the wavelength conversion material layer with the laser, if the power of the laser is lower, then the depth of the first groove may be shallower; if the scanning speed of the laser is lower, then the spacing of the microstructures may be closer. Therefore, the relevant parameters of the laser sintering may be selected according to the desired microstructure spacing and/or groove depth, and are not particularly limited by the disclosure.

In some embodiments, before irradiating the wavelength conversion material layer with the laser, the wavelength conversion material layer may be heat-treated to volatilize the first solvent from the wavelength conversion material layer.

In some embodiments, the material of the wavelength conversion layer of the wavelength conversion device may include an inorganic material and a fluorescent material, and may further include an adhesive. In some embodiments, the inorganic material of the wavelength conversion layer may include, for example, aluminum oxide ($Al_2O_3$), yttrium oxide ($Y_2O_3$), lutetium oxide ($Lu_2O_3$), or a combination thereof. The formed fluorescent material may include, for example, yttrium aluminum garnet, lutetium aluminum garnet, or a combination thereof. For example, when the precursor for the sol-gel method is aluminum chloride, the aluminum chloride may be hydrolyzed and polymerized in the first solvent to form an aluminum hydroxide gel. The aluminum hydroxide forms a solid alumina after being sintered by the laser. The adhesive may, for example, further adhere the inorganic material in the wavelength conversion layer to the fluorescent material, which may also enable the wavelength conversion layer to be firmly adhered on the substrate.

It should be particularly noted that although the manufacturing method of the wavelength conversion device of the embodiment is illustrated using the above method as an example, the manufacturing method of the wavelength conversion device of the disclosure is not limited thereto.

Figure 2A:
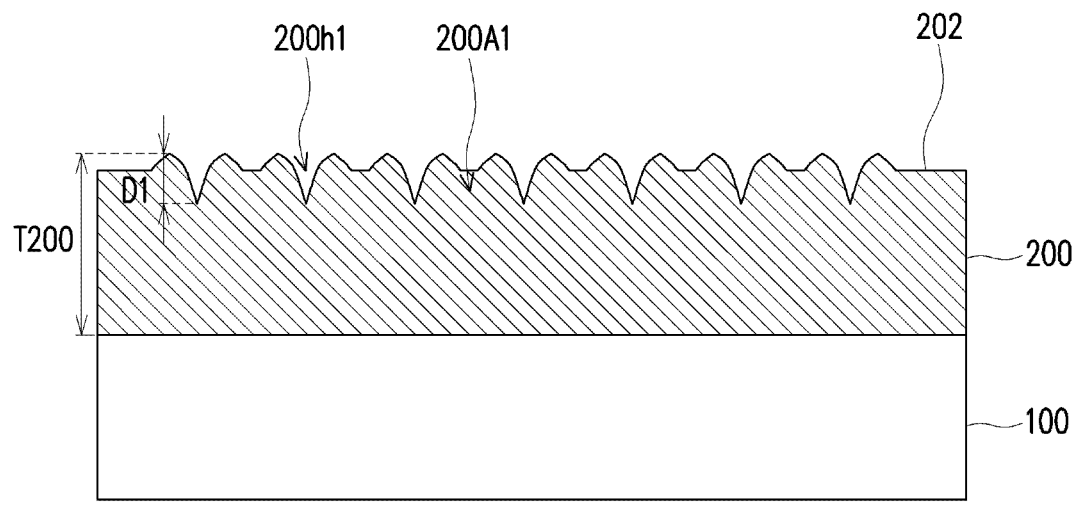
FIG. 2A is a partial cross-sectional schematic view of the wavelength conversion device according to an embodiment of the disclosure.
Figure 2B:
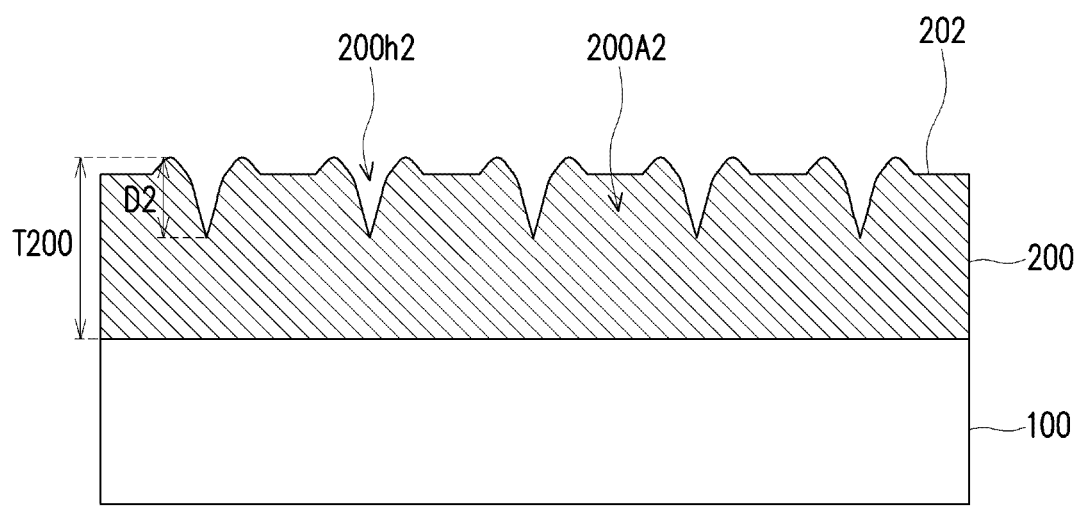
FIG. 2B is a partial cross-sectional schematic view of a wavelength conversion device according to another embodiment of the disclosure.

FIG. 2A is a partial cross-sectional schematic view of the wavelength conversion device according to an embodiment of the disclosure. FIG. 2B is a partial cross-sectional schematic view of a wavelength conversion device according to another embodiment of the disclosure. The embodiments in FIGS. 2A and 2B continue to use a part of the content and reference numerals of the embodiment in FIG. 1, and the description of the same or similar technical content may be omitted.

With reference to FIG. 2A, a wavelength conversion device 10a includes a substrate 100 and a wavelength conversion layer 200. The material of the substrate 100 may be, for example, aluminum, aluminum alloy, copper, copper alloy, aluminum nitride, or silicon carbide, to have good thermal conductivity and heat resistance. The wavelength conversion layer 200 is, for example, disposed on the substrate 100. In some embodiments, the wavelength conversion layer 200 may include an inorganic material and a fluorescent material, and may also include an adhesive. In some embodiments, a thickness T200 of the wavelength conversion layer 200 is from 0.1 mm to 0.5 mm. The wavelength conversion layer 200 has, for example, a plurality of first microstructures 200A1 on a surface 202 away from the substrate 100. The plurality of first grooves 200h1 are formed between adjacent first microstructures 200A1. The first microstructure 200A1 may, for example, have the shape of a crater, that is, a depression in the center of the first microstructure 200A1, but the disclosure is not limited thereto. A depth D1 of the first groove 200h1 is, for example, less than half of the thickness T200 of the wavelength conversion layer 200. For example, the depth D1 of the first groove 200h1 may be less than 0.25 mm. In some embodiments, the multiple first microstructures 200A1 and/or the first grooves 200h1 of the wavelength conversion layer 200 may be arranged in an array.

The wavelength conversion layer 200 of the wavelength conversion device 10a of the embodiment includes the plurality of first microstructures 200A1. When the wavelength conversion device 10a is applied to a projection system, and the blue light from a laser light source of a light source system irradiates the surface 202 of the wavelength conversion layer 200 with the plurality of first grooves 200h1, a part of the blue light may enter the first grooves 200h1 without being reflected. Therefore, more of the blue light excites the fluorescent material in the wavelength conversion layer 200 to emit yellow light, thereby increasing the light conversion efficiency of the wavelength conversion layer 200 of the embodiment. Based on this, the wavelength conversion layer 200 of the embodiment may also have good anti-reflection capability without the disposition of an anti-reflection layer, therefore the manufacturing cost can be reduced.

With reference to FIG. 2B, a wavelength conversion device 10b of the embodiment also includes a substrate 100, and a wavelength conversion layer 200. The main difference between the wavelength conversion device 10b of the embodiment and the wavelength conversion device 10a is that a depth D2 of a first groove 200h2 is greater than the depth D1 of the first groove 200h1, and a distance between the adjacent first grooves 200*h*2 is greater than a distance between the adjacent first grooves 200*h*1. That is, compared to the first microstructure 200A1, the size of the first microstructure 200A2 is increased. The reason for the above differences includes the laser that forms the first groove 200*h*2 having a larger power, and a faster scanning speed. Similar to the wavelength conversion device 10*a*, the wavelength conversion device 10*b* of the embodiment also has a higher light conversion efficiency, and details will not be reiterated here.

Figure 3:
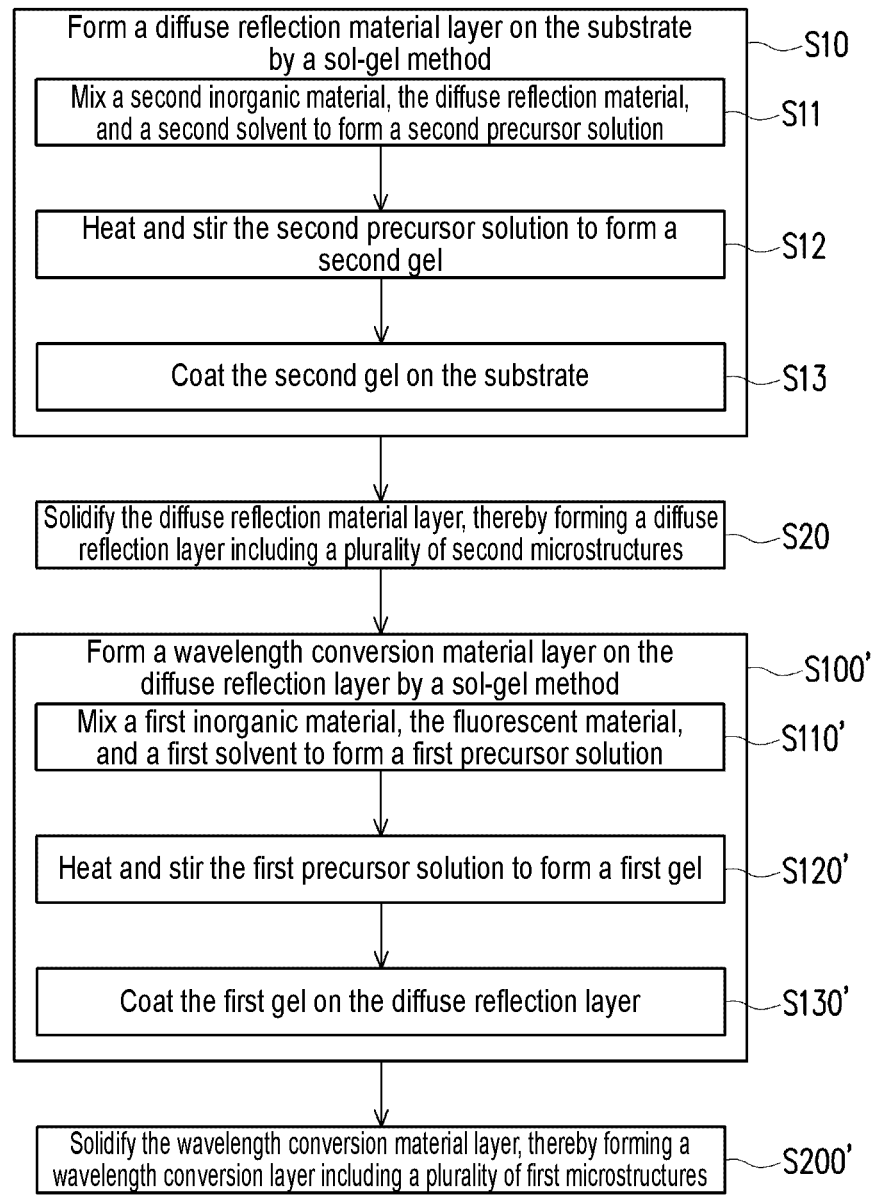
FIG. 3 is a flowchart of a manufacturing method of a wavelength conversion device according to another embodiment of the disclosure.

In some embodiments, before Step S100 and Step S200, a diffuse reflection layer may be formed on the substrate. The diffuse reflection layer is located between the substrate and the wavelength conversion layer. FIG. 3 is a flowchart of a manufacturing method of a wavelength conversion device according to another embodiment of the disclosure. With reference to FIG. 3, in Step S10, the diffuse reflection material layer is formed on the substrate by a sol-gel method. In some embodiments, the diffuse reflection material layer includes a second colloidal material, and a diffuse reflection material. For example, the second colloidal material may be a metal hydroxide, and the type of metal may be optionally selected depending on a precursor used for the sol-gel method. For example, the second colloidal material may include aluminum hydroxide. The diffuse reflection material may, for example, include a plurality of white scattering particles with high reflectivity to facilitate reflection of a light beam. In some embodiments, the diffuse reflection material may be titanium dioxide, aluminum oxide, barium sulfate, aluminum nitride, or a combination thereof.

The following paragraphs will introduce an embodiment of forming the diffuse reflection material layer by the sol-gel method, but the disclosure is not limited thereto. As shown in FIG. 3, the Step S10 includes Step S11, Step S12, and Step S13, but the disclosure is not limited thereto. In Step S11, a second inorganic material, the diffuse reflection material, and a second solvent are mixed to form a second precursor solution. In some embodiments, the second inorganic material includes metal salts such as aluminum chloride, aluminum nitrate, or a combination thereof, but the disclosure is not limited thereto. In other embodiments, the second inorganic material may include a metallic alkoxy compound. The second solvent may be, for example, an organic solvent, and is not particularly limited by the disclosure.

In Step S12, the second precursor solution is heated, and stirred to form a second gel. The temperature may be further increased during the stirring of the second precursor solution. In detail, after the second inorganic material, the diffuse reflection material, and the second solvent are mixed to form the second precursor solution, the second precursor solution may be heated to a range of 60° C. to 100° C., and stirred for a period of 10 minutes to 120 minutes. The second inorganic material may undergo a hydrolysis reaction and a polycondensation reaction with the second solvent. The hydrolysis reaction causes metal cations in the second inorganic material to be hydrolyzed to be formed as reactive monomers with hydroxyl (—OH). The polycondensation reaction causes the reactive monomers to polymerize with each other, and undergo dehydration to form the second colloidal material (sol). The second colloidal material is further polymerized gradually, and forms a second gel with the diffuse reflection material. In other embodiments, an adhesive may be selectively added to the second precursor solution. The adhesive is, for example, a polymer soluble in the second solvent.

In step S13, the second gel is coated on the substrate. The method of coating the second gel on the substrate is similar to coating of the first gel, and will not be reiterated here. As of now, the diffuse reflection material layer has been formed on the substrate.

In step S20, the diffuse reflection material layer is solidified, thereby forming a diffuse reflection layer including a plurality of second microstructures. In the embodiment, the method of solidifying the diffuse reflection material layer includes sintering the diffuse reflection material layer with a laser, which is similar to the method of solidifying the wavelength conversion material layer, and will not be reiterated here.

In some embodiments, the second colloidal material melts and deforms after being irradiated by the laser, thereby forming the plurality of second microstructures on a surface, and multiple second grooves may be formed between two adjacent microstructures.

In some embodiments, a depth of the second groove is less than half of a thickness of the diffuse reflection layer. That is, for example, the depth of the second groove may be less than 0.25 mm. In some embodiments, the second grooves of the diffuse reflection layer may be arranged in an array. In some embodiments, the thickness of the diffuse reflection layer is, for example, from 0.02 mm to 0.5 mm. Since the diffuse reflection layer includes the diffuse reflection material that has high reflectivity, a part of the light beam, after entering the second groove, may be reflected multiple times before exiting.

In other embodiments, before irradiating the diffuse reflection material layer with the laser, the diffuse reflection material layer may be heat-treated to volatilize the second solvent from the diffuse reflection material layer.

In some embodiments, the material of the diffuse reflection layer may include an inorganic material and a diffuse reflection material, and may further include an adhesive. In some embodiments, the diffuse reflection material of the diffuse reflection layer may include titanium dioxide, aluminum oxide, barium sulfate, aluminum nitride, or a combination thereof. The inorganic material of the diffuse reflection layer may include aluminum chloride, aluminum nitrate, or a combination thereof. For example, when the precursor for the sol-gel method is aluminum chloride, the aluminum chloride may be hydrolyzed and polymerized in the second solvent to form an aluminum hydroxide gel. The aluminum hydroxide gel forms a solid alumina after being sintered by the laser. The adhesive may, for example, further adhere the inorganic material in the diffuse reflection layer to the diffuse reflection material, which may also enable the diffuse reflection layer to be firmly adhered to the substrate.

With reference to FIG. 3, Step S100' to Step S200' are similar to the Step S100 to the Step S200. The main difference is that a wavelength conversion material layer is formed on a surface of the diffuse reflection layer in the Step S100' to the Step S200'. In some embodiments, the wavelength conversion material layer may fill the second grooves of the diffuse reflection layer.

Based on the above, the embodiment forms the diffuse reflection layer on the substrate. The diffuse reflection layer may reflect the light beam that passed through the wavelength conversion layer, so that more of the light beam may return to the wavelength conversion layer, thereby increasing the light conversion efficiency of the wavelength conversion device. It should be particularly noted that although the manufacturing method of the wavelength conversion device of the embodiment is illustrated using the above method as an example, the manufacturing method of the wavelength conversion device of the disclosure is not limited thereto.

Figure 4:
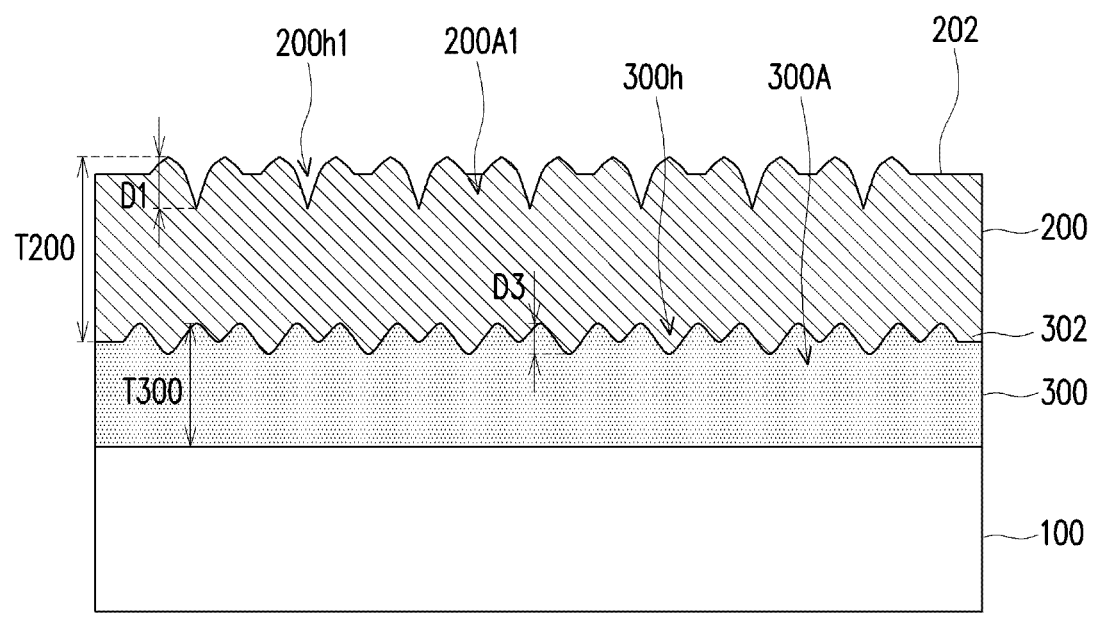
FIG. 4 is a partial cross-sectional schematic view of the wavelength conversion device according to yet another embodiment of the disclosure.

FIG. 4 is a partial cross-sectional schematic view of a wavelength conversion device according to yet another embodiment of the disclosure. The embodiment in FIG. 4 continues to use a part of the content and reference numerals of the embodiments in FIGS. 2A and 3, and the description of the same technical content is omitted. Please refer to the description and effects of the foregoing embodiments for the description of the omitted parts, which will not be reiterated in the following embodiments.

With reference to FIG. 4, a wavelength conversion device 10c of the embodiment includes a substrate 100, a wavelength conversion layer 200, and a diffuse reflection layer 300 disposed between the substrate 100 and the wavelength conversion layer 200. A surface 302 of the diffuse reflection layer 300 away from the substrate 100 may, for example, include a plurality of second microstructures 300A. A second groove 300h may be formed between two adjacent second microstructures 300A. For example, the second microstructure 300A may have the shape of a crater, that is, a depression in the center of the second microstructure 300A, but the disclosure is not limited thereto. A depth D3 of the second groove 300h may be less than half of a thickness T300 of the diffuse reflection layer 300. In some embodiments, the depth D3 of the second groove 300h may be less than 0.25 mm. In some embodiments, the second microstructures 300A and/or the second grooves 300h of the diffuse reflection layer 300 may be arranged in an array. In some embodiments, the diffuse reflection layer 300 may include an inorganic material and a diffuse reflection material, and may also include an adhesive. In some embodiments, the thickness T300 of the diffuse reflection layer 300 is from 0.02 mm to 0.5 mm.

In summary, the wavelength conversion layer of the wavelength conversion device of the disclosure includes the multiple first microstructures and the plurality of first grooves. When the light beam irradiates the surface of the wavelength conversion layer having the multiple first grooves, more of the light beam may enter the first grooves without being reflected, so that more of the light beam may excite the fluorescent material in the wavelength conversion layer to emit a converted light beam of yellow light, thereby increasing the light conversion efficiency of the wavelength conversion device of the embodiment. Furthermore, the diffuse reflection layer formed beneath the wavelength conversion layer may further return more of the light beam to the wavelength conversion layer to excite the fluorescent material, which can also increase the light conversion efficiency of the wavelength conversion device of the embodiment. In the embodiment of the disclosure, the diffuse reflection layer or the wavelength conversion material layer is formed on the substrate or the diffuse reflection layer by the sol-gel method, which has a more convenient process, lesser number of processes, and/or a lower manufacturing cost.

The foregoing description of the exemplary embodiments of the disclosure has been presented for purposes of illustration and description. It is not intended to be exhaustive or to limit the disclosure to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the disclosure and its best mode practical application, thereby enabling persons skilled in the art to understand the disclosure for various embodiments and with various modifications as are suited to the particular use or implementation contemplated. It is intended that the scope of the disclosure be defined by the claims appended hereto and their equivalents in which all terms are meant in their broadest reasonable sense unless otherwise indicated. Therefore, the terms "the disclosure", "the invention" or the like does not necessarily limit the claim scope to a specific embodiment, and the reference to particularly preferred exemplary embodiments of the disclosure does not imply a limitation on the disclosure, and no such limitation is to be inferred.

The disclosure is limited only by the spirit and scope of the appended claims.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims.

Furthermore, the terms such as "first" and "second" mentioned in this specification or the appended claims are used to name different elements or to distinguish between different embodiments or ranges, and are not intended to limit the upper or lower limit of the number of elements. Any advantages and benefits described may not apply to all embodiments of the disclosure. It should be appreciated that variations may be made in the embodiments described by persons skilled in the art without departing from the scope of the disclosure as defined by the following claims. Moreover, no element and component in the disclosure is intended to be dedicated to the public regardless of whether the element or component is explicitly recited in the following claims.

What is claimed is:

1. A manufacturing method of a wavelength conversion device, comprising:
    forming a wavelength conversion material layer on a substrate by a sol-gel method, comprising:
        mixing a first inorganic material, a fluorescent material, and a first solvent to form a first precursor solution;
        stirring the first precursor solution and adding an adhesive when stirring the first precursor solution to form a first gel, wherein the first inorganic material is formed as a first colloidal material, and the adhesive comprises polyethylene alcohol (PVA), polyvinyl butyral resin (PVB), polyvinylpyrrolidone (PVP), or a combination thereof; and
        coating the first gel on the substrate,
    wherein the wavelength conversion material layer comprises the first colloidal material, and the fluorescent material; and
    solidifying the wavelength conversion material layer to form a wavelength conversion layer comprising a plurality of first microstructures, wherein the step of solidifying the wavelength conversion material layer comprises irradiating the wavelength conversion material layer with a laser.

2. The manufacturing method of the wavelength conversion device according to claim 1, wherein the first inorganic material comprises aluminum chloride, aluminum nitrate, or a combination thereof.

3. The manufacturing method of the wavelength conversion device according to claim 1, wherein the step of solidifying the wavelength conversion material layer further comprises:

heat-treating the wavelength conversion material layer, before irradiating the wavelength conversion material layer with the laser.

4. The manufacturing method of the wavelength conversion device according to claim 1, wherein a first groove is formed between adjacent two of the plurality of first microstructures, and a depth of the first groove is less than half of a thickness of the wavelength conversion layer.

5. The manufacturing method of the wavelength conversion device according to claim 1, wherein a thickness of the wavelength conversion layer is from 0.1 mm to 0.5 mm.

6. The manufacturing method of the wavelength conversion device according to claim 1, wherein a material of the wavelength conversion layer comprises aluminum oxide, yttrium oxide, lutetium oxide, yttrium aluminum garnet, lutetium aluminum garnet, or a combination thereof.

7. The manufacturing method of the wavelength conversion device according to claim 1, further comprising:
 forming a diffuse reflection layer on the substrate, before forming the wavelength conversion material layer on the substrate by the sol-gel method, wherein the diffuse reflection layer is located between the wavelength conversion layer and the substrate.

8. The manufacturing method of the wavelength conversion device according to claim 7, wherein the step of forming the diffuse reflection layer on the substrate comprises:
 forming a diffuse reflection material layer on the substrate by the sol-gel method, wherein the diffuse reflection material layer comprises a second colloidal material, and a diffuse reflection material; and
 solidifying the diffuse reflection material layer to form a diffuse reflection layer comprising a plurality of second microstructures, wherein the step of solidifying the diffuse reflection material layer comprises irradiating the diffuse reflection material layer with the laser.

9. The manufacturing method of the wavelength conversion device according to claim 8, wherein the step of forming the diffuse reflection material layer on the substrate by the sol-gel method comprises:
 mixing a second inorganic material, the diffuse reflection material, and a second solvent to form a second precursor solution;
 stirring the second precursor solution to form a second gel, wherein the second inorganic material is formed as the second colloidal material; and
 coating the second gel on the substrate.

10. The manufacturing method of the wavelength conversion device according to claim 9, wherein the second inorganic material comprises aluminum chloride, aluminum nitrate, or a combination thereof.

11. The manufacturing method of the wavelength conversion device according to claim 8, wherein the diffuse reflection material comprises titanium dioxide, aluminum oxide, barium sulfate, aluminum nitride, or a combination thereof.

12. The manufacturing method of the wavelength conversion device according to claim 8, wherein the step of solidifying the diffuse reflection material layer further comprises:
 heat-treating the diffuse reflection material layer, before irradiating the diffuse reflection material layer with the laser.

13. The manufacturing method of the wavelength conversion device according to claim 8, wherein a second groove is formed between adjacent two of the plurality of second microstructures, and a depth of the second groove is less than half of a thickness of the diffuse reflection layer.

14. The manufacturing method of the wavelength conversion device according to claim 7, wherein a thickness of the diffuse reflection layer is from 0.02 mm to 0.5 mm.

15. A wavelength conversion device, comprising a substrate and a wavelength conversion layer, wherein the wavelength conversion layer comprises a plurality of first microstructures on a surface away from the substrate, and the wavelength conversion layer is produced by:
 forming a wavelength conversion material layer on the substrate by a sol-gel method, comprising:
  mixing a first inorganic material, a fluorescent material, and a first solvent to form a first precursor solution;
  stirring the first precursor solution and adding an adhesive when stirring the first precursor solution to form a first gel, wherein the first inorganic material is formed as a first colloidal material, and the adhesive comprises polyethylene alcohol (PVA), polyvinyl butyral resin (PVB), polyvinylpyrrolidone (PVP), or a combination thereof; and
  coating the first gel on the substrate,
 wherein the wavelength conversion material layer comprises the first colloidal material, and the fluorescent material; and
 solidifying the wavelength conversion material layer to form the wavelength conversion layer, wherein the step of solidifying the wavelength conversion material layer comprises irradiating the wavelength conversion material layer with a laser.

16. The wavelength conversion device according to claim 15, wherein the wavelength conversion device further comprises a diffuse reflection layer, the diffuse reflection layer is disposed between the wavelength conversion layer and the substrate, the diffuse reflection layer comprises a plurality of second microstructures on a surface away from the substrate, and the diffuse reflection layer is produced by:
 forming a diffuse reflection material layer on the substrate by the sol-gel method, wherein the diffuse reflection material layer comprises a second colloidal material, and a diffuse reflection material; and
 solidifying the diffuse reflection material layer to form the diffuse reflection layer, wherein the step of solidifying the diffuse reflection material layer comprises irradiating the diffuse reflection material layer with the laser.

* * * * *